(12) United States Patent
Kuo et al.

(10) Patent No.: US 7,833,809 B2
(45) Date of Patent: Nov. 16, 2010

(54) LIGHT EMITTING DIODE, OPTOELECTRONIC DEVICE AND METHOD OF FABRICATING THE SAME

(75) Inventors: Cheng-Huang Kuo, Tainan County (TW); Wei-Chih Lai, Chiayi County (TW); Chi-Wen Kuo, Tainan County (TW)

(73) Assignee: National Central University, Taoyuan (TW)

( * ) Notice: Subject to any disclaimer, the term of this patent is extended or adjusted under 35 U.S.C. 154(b) by 286 days.

(21) Appl. No.: 12/117,746

(22) Filed: May 9, 2008

(65) Prior Publication Data

US 2008/0315226 A1      Dec. 25, 2008

(30) Foreign Application Priority Data

Jun. 20, 2007    (TW) ............................... 96122017 A

(51) Int. Cl.
H01L 21/00         (2006.01)
(52) U.S. Cl. .......................................... 438/22; 438/24

(58) Field of Classification Search .................. 438/22, 438/24
See application file for complete search history.

(56) References Cited

U.S. PATENT DOCUMENTS 6,455,337 B1 *   9/2002   Sverdlov .................... 438/22
6,847,046 B1     1/2005   Wei et al.

* cited by examiner

Primary Examiner—Thien F Tran
(74) Attorney, Agent, or Firm—Jianq Chyun IP Office

(57) ABSTRACT

A light emitting diode structure including a substrate, a strain-reducing seed layer, an epitaxial layer, a first electrode and a second electrode is provided. The strain-reducing seed layer having a plurality of clusters is disposed on the substrate, and the material of the clusters is selected from a group consisting of aluminum nitride, magnesium nitride and indium nitride. The epitaxial layer includes a first type doped semiconductor layer, a light emitting layer and a second type doped semiconductor layer. The first electrode is disposed on the exposed first type doped semiconductor layer and electrically connected thereto. The second electrode is disposed on the second type doped semiconductor layer and electrically connected thereto.

11 Claims, 4 Drawing Sheets

LIGHT EMITTING DIODE, OPTOELECTRONIC DEVICE AND METHOD OF FABRICATING THE SAME

CROSS-REFERENCE TO RELATED APPLICATION

This application claims the priority benefit of Taiwan application serial no. 96122017, filed on Jun. 20, 2007. The entirety of the above-mentioned patent application is hereby incorporated by reference herein and made a part of specification.

BACKGROUND OF THE INVENTION

1. Field of the Invention

The present invention generally relates to a light emitting diode structure and method of fabricating the same, and more particularly, to a light emitting diode structure having a strain-reducing seed layer for reducing the dislocation density thereof and a method of fabricating the same.

2. Description of Related Art

Light emitting diode is a semiconductor device used in a light emitting device. Because of low power consumption, low contamination, long working life, and rapid responding speed, light emitting diode is useful in many areas such as traffic bulletin boards, outdoor display panels and the back light of displays. Therefore, light emitting diodes have become one of the most important products in the optoelectronic industry.

FIG. 1 is a schematic cross-sectional view of a convention light emitting diode. As shown in FIG. 1, a conventional light emitting diode 100 includes a substrate 110, a buffer layer 120, a first type doped semiconductor layer 130, a light emitting layer 140, a second type doped semiconductor layer 150, a first electrode 160 and a second electrode 170. The buffer layer 120 is disposed on the substrate 110. The first type doped semiconductor layer 130 is disposed on the buffer layer 120. The light emitting layer 140 is disposed on a portion of the area of the first type doped semiconductor layer 130. The second type doped semiconductor layer 150 is disposed on the light emitting layer 130. The first electrode 160 is disposed on the first type doped semiconductor layer 130 not covered by the light emitting layer 140, and the second electrode 170 is disposed on the second type doped semiconductor layer 150.

As shown in FIG. 1, there is a large difference between the lattice constant of the first type doped semiconductor layer 130 and the lattice constant of the substrate 110. Therefore, the light emitting diode 100 normally has a buffer layer 120 disposed between the first type doped semiconductor layer 130 and the substrate 110 for reducing lattice mismatch due to the difference in their lattice constants. In other words, the buffer layer 120 can be used to improve the epitaxial quality of the first type doped semiconductor layer 130, the light emitting layer 140 and the second type doped semiconductor layer 150, and hence prevent the efficiency of the light emitting diode 100 from being affected.

In the conventional light emitting diode 100, material having a lower epitaxial temperature such as aluminum-gallium nitride ($Al_xGa_{1-x}N$) or indium-gallium nitride ($In_xGa_{1-x}N$) is normally used as the material of the buffer layer 120. Next, a gallium nitride (GaN) layer is formed on the buffer layer 120 to serve as the first type doped semiconductor layer 130. However, the gallium nitride layer grown on the buffer layer 120 may have a dislocation density in excess of $5 \times 10^8$ cm$^{-2}$.

The high dislocation density can have some adverse effects on the property and performance of the light emitting diode 100.

To resolve the problem of having a high dislocation density, U.S. Pat. No. 6,847,046 has disclosed a method of using a super lattice structure formed by combining a silicon nitride ($SiN_x$) compound and an aluminum-indium-gallium nitride (AlInGaN) to serve as the buffer layer of the light emitting diode. However, the clusters formed by the silicon nitride compound have a small distance of separation, only in the nanometer scale. Therefore, when aluminum-indium-gallium nitride is subsequently grown in an epitaxial process on the silicon nitride compound, the dislocation density can be lowered to at most $10^8$ cm$^{-2}$ because the clusters formed by the silicon nitride compound are separate only on the nanometer scale. Consequently, it is very difficult to improve the quality of the light emitting diode any further.

SUMMARY OF THE INVENTION

Accordingly, the present invention provides a light emitting diode structure and a method of fabricating the same. To produce the light emitting diode structure, a strain-reducing seed layer is formed on a substrate. Thereafter, the required high temperature gallium nitride epitaxial layer is directly formed on the strain-reducing seed layer. The present invention utilizes the stain-reducing seed layer to lower the structural strain of a subsequently formed high temperature material so as to reduce the dislocation density of a subsequently deposited gallium nitride film layer.

The present invention also provides an optoelectronic device and a method of fabricating the same. To produce the optoelectronic device, a strain-reducing seed layer is formed on a substrate. Thereafter, the required optoelectronic device structure, for example, a laser diode, a photo detector or a solar cell, is formed on the stain-reducing seed layer. Therefore, the dislocation density of the subsequently formed optoelectronic device is lowered through the disposition of the strain-reducing seed layer.

According to an embodiment of the present invention, a light emitting diode structure including a substrate, a strain-reducing seed layer, an epitaxial layer, a first electrode and a second electrode is provided. The strain-reducing seed layer having a plurality of clusters is disposed on the substrate, and the material of the clusters is selected from a group consisting of aluminum nitride, magnesium nitride and indium nitride. The epitaxial layer includes a first type doped semiconductor layer, a light emitting layer and a second type doped semiconductor layer. The first type doped semiconductor layer is disposed on the strain-reducing seed layer, the light emitting layer is disposed on a portion of the area of the first type doped semiconductor layer, and the second type doped semiconductor layer is disposed on the light emitting layer. The first electrode is disposed on the first type doped semiconductor layer not covered by the light emitting layer and electrically connected to the first type doped semiconductor layer. The second electrode is disposed on the second type doped semiconductor layer and electrically connected thereto, wherein the first electrode is electrically insulated from the second electrode.

In an embodiment of the present invention, the light emitting diode structure further includes an epitaxial lateral overgrowth layer disposed between the strain-reducing seed layer and the first type doped semiconductor layer and covering the clusters and the substrate. More specifically, the material of the epitaxial lateral overgrowth layer includes aluminum-indium-gallium nitride.

In an embodiment of the present invention, the material of the substrate includes silicon, glass, gallium arsenide, gallium nitride, aluminum-gallium arsenide, gallium phosphide, silicon carbide, indium phosphide, boron nitride, zinc oxide, aluminum oxide, lithium aluminate or aluminum nitride.

In an embodiment of the present invention, the first type doped semiconductor layer is an n-type semiconductor layer, and the second type doped semiconductor layer is a p-type semiconductor layer.

In an embodiment of the present invention, the light emitting layer includes a multiple quantum well (MQW), a single quantum well (SQW) or a double hetero (DH) structure.

The present invention also provides a method of fabricating a light emitting diode structure that includes the following steps. First, a substrate is provided. Thereafter, a metallic material is spread on the substrate, wherein the metallic material is selected from a group consisting of aluminum, magnesium and indium. Next, a nitrogen-containing gas is provided so that the metallic material can react with the nitrogen-containing gas to form a strain-reducing seed layer. The strain-reducing seed layer includes a plurality of clusters, and the material of the clusters is selected from a group consisting of aluminum nitride, magnesium nitride and indium nitride. Next, an epitaxial layer is formed on the strain-reducing seed layer. The epitaxial layer includes a first type doped semiconductor layer, a light emitting layer and a second type doped semiconductor layer, and the light emitting layer is formed on a portion of the first type doped semiconductor layer. Finally, a first electrode and a second electrode are formed on the exposed first type doped semiconductor layer and the second type doped semiconductor layer, respectively. The first electrode is electrically connected to the first type doped semiconductor layer, and the second electrode is electrically connected to the second type doped semiconductor layer.

In an embodiment of the present invention, after forming the stain-reducing seed layer, further includes forming an epitaxial lateral overgrowth layer to cover the clusters and the substrate. More specifically, the material of the epitaxial lateral overgrowth layer includes aluminum-indium-gallium nitride.

In an embodiment of the present invention, the material of the substrate includes silicon, glass, gallium arsenide, gallium nitride, aluminum-gallium arsenide, gallium phosphide, silicon carbide, indium phosphide, boron nitride, zinc oxide, aluminum oxide, lithium aluminate or aluminum nitride.

In an embodiment of the present invention, the nitrogen-containing gas includes ammonia, 1-Dimethylhydrazine (UDMHy) or Tertiarybutylhydrazine (TBHy).

In an embodiment of the present invention, the first type doped semiconductor layer is an n-type semiconductor layer, and the second type doped semiconductor layer is a p-type semiconductor layer.

In an embodiment of the present invention, the light emitting layer includes a multiple quantum well (MQW), a single quantum well (SQW) or a double hetero (DH) structure.

The present invention also provides an optoelectronic device. The optoelectronic device includes a substrate, a strain-reducing seed layer and an optoelectronic device unit. The strain-reducing seed layer having a plurality of clusters is disposed on the substrate. The material of the clusters is selected from a group consisting of aluminum nitride, magnesium nitride and indium nitride. The optoelectronic device unit is disposed on the strain-reducing seed layer.

In an embodiment of the present invention, the optoelectronic device further includes an epitaxial lateral overgrowth layer disposed between the strain-reducing seed layer and the optoelectronic device unit to cover the clusters and the substrate. More specifically, the material of the epitaxial lateral overgrowth layer includes aluminum-indium-gallium nitride.

In an embodiment of the present invention, the optoelectronic device unit includes a laser diode, a photo detector or a solar cell.

The present invention also provides a method of fabricating an optoelectronic device that includes the following steps. First, a substrate is provided. Thereafter, a metallic material is spread on the substrate, wherein the metallic material is selected from a group consisting of aluminum, magnesium and indium. Next, a nitrogen-containing gas is provided so that the metallic material can react with the nitrogen-containing gas to form a strain-reducing seed layer. The strain-reducing seed layer includes a plurality of clusters, and the material of the clusters is selected from a group consisting of aluminum nitride, magnesium nitride and indium nitride. Next, an optoelectronic device unit is formed on the strain-reducing seed layer.

In an embodiment of the present invention, after forming the stain-reducing seed layer, further includes forming an epitaxial lateral overgrowth layer to cover the clusters and the substrate. More specifically, the material of the epitaxial lateral overgrowth layer includes aluminum-indium-gallium nitride.

In an embodiment of the present invention, the material of the epitaxial lateral overgrowth layer includes aluminum-indium-gallium nitride.

In an embodiment of the present invention, the nitrogen-containing gas includes ammonia, 1-Dimethylhydrazine (UDMHy) or Tertiarybutylhydrazine (TBHy).

The light emitting diode structure and optoelectronic device of the present invention is produced by forming a strain-reducing seed layer on the substrate and then directly forming the required high temperature material on the stain-reducing seed layer. The present invention utilizes the strain-reducing seed layer to lower the structural strain of the subsequently formed high temperature material so as to improve the performance of the light emitting diode structure or optoelectronic device.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
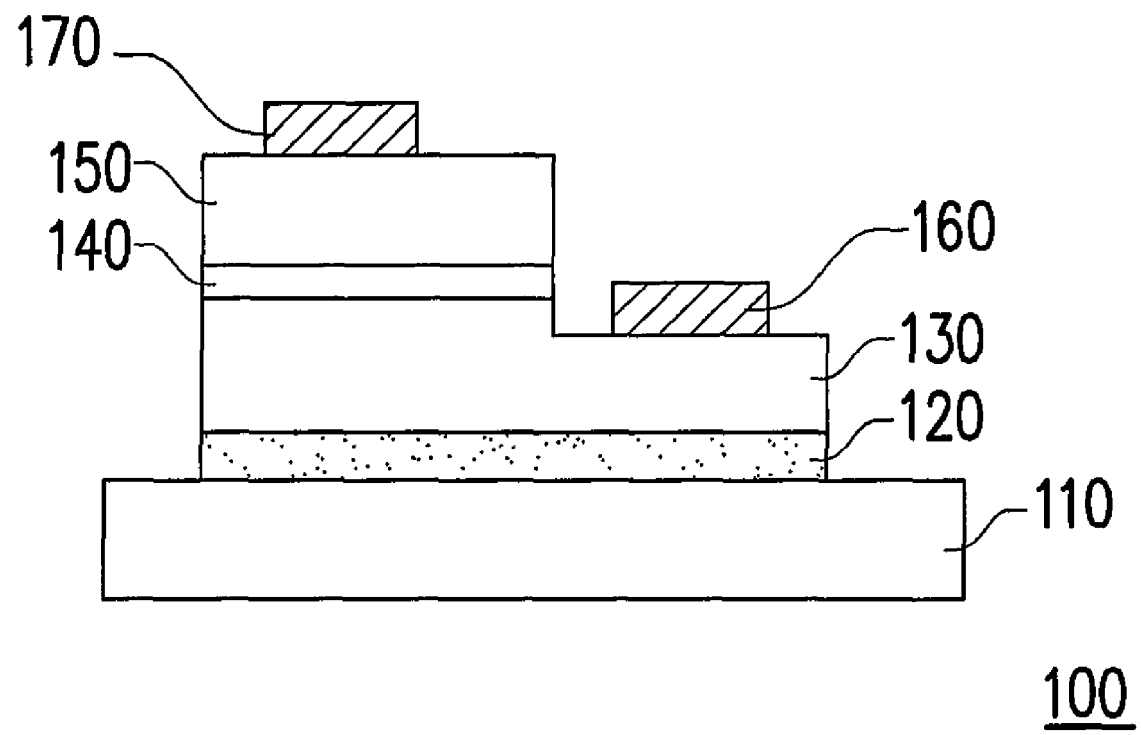
FIG. 1 is a schematic cross-sectional view of a convention light emitting diode.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
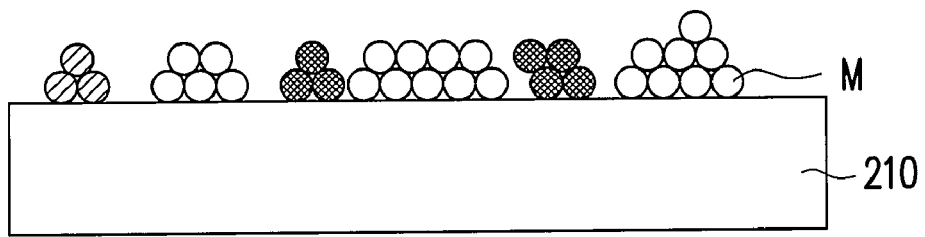
FIGS. 2A to 2F are schematic cross-sectional views showing the steps in a method of fabricating a light emitting diode structure according to the present invention.

FIGS. 2A to 2F are schematic cross-sectional views showing the steps in a method of fabricating a light emitting diode structure according to the present invention. First, as shown in FIG. 2A, a substrate 210 is provided. Then, a metallic material M is spread on the substrate 210. The metallic material M is selected from a group consisting of aluminum, magnesium and indium. The substrate 210 can be fabricated using a material selected from a group consisting of silicon, glass, gallium arsenide, gallium nitride, aluminum-gallium arsenide, gallium phosphide, silicon carbide, indium phosphide, boron nitride, zinc oxide, aluminum oxide, lithium aluminate and aluminum nitride. In the present embodiment, all three metallic materials, aluminum, magnesium and indium, are spread on the substrate 210. However, a user may choose to spread only one or any two of the three metallic materials on the substrate 210 according to different applications. Here, the present invention is not intended to provide any restrictions.

Figure 2B:
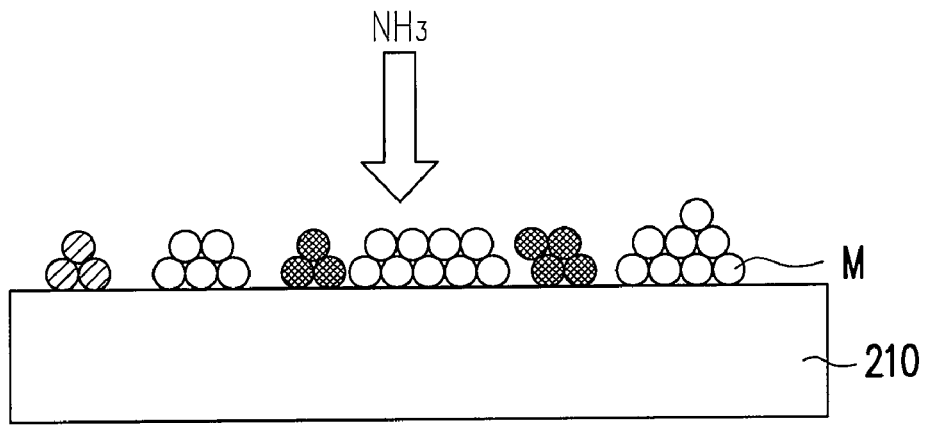
Figure 2C:
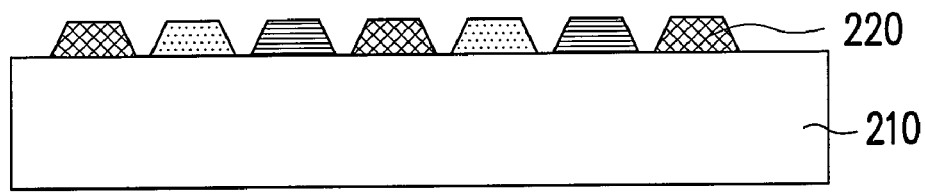
Figure 2D:
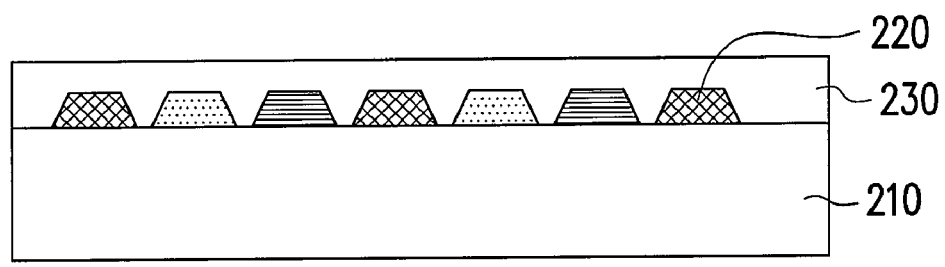

Thereafter, as shown in FIG. 2B, a nitrogen-containing gas, for example, ammonia ($NH_3$), is provided so that the metallic material M can react with the nitrogen-containing gas to form a strain-reducing seed layer 220 as shown in FIG. 2C. The strain-reducing seed layer 220 includes a plurality of clusters. The material of these clusters is selected from a group consisting of aluminum nitride, magnesium nitride and indium nitride, and the difference in material depends on the metallic material M used in FIG. 2A. The main characteristic of the present invention is to lower the structural strain of subsequently formed high temperature material through the strain-reducing seed layer so that the property of the light emitting diode structure is improved.

Next, as shown in FIG. 2C, an epitaxial lateral overgrowth layer 230 is selectively formed on the strain-reducing seed layer 220 to cover the clusters and the substrate 210. In the present embodiment, epitaxial aluminum-indium-gallium nitride is grown on the substrate 210 and the clusters. Because the epitaxial aluminum-indium-gallium nitride will selectively grow on the surface of the substrate 210 instead of depositing on the surface of the clusters, the epitaxial aluminum-indium-gallium nitride grows sideways over the clusters and gradually covers the clusters and the substrate 210 after growing to a definite height above the substrate 210 between the clusters. As a result, the epitaxial lateral overgrowth layer 230 is formed. Moreover, the growth parameters for forming the epitaxial lateral overgrowth layer 230 can be adjusted, for example, increasing the growing temperatures or lowering the III/V ratio, so as to facilitate side growth.

Figure 2E:
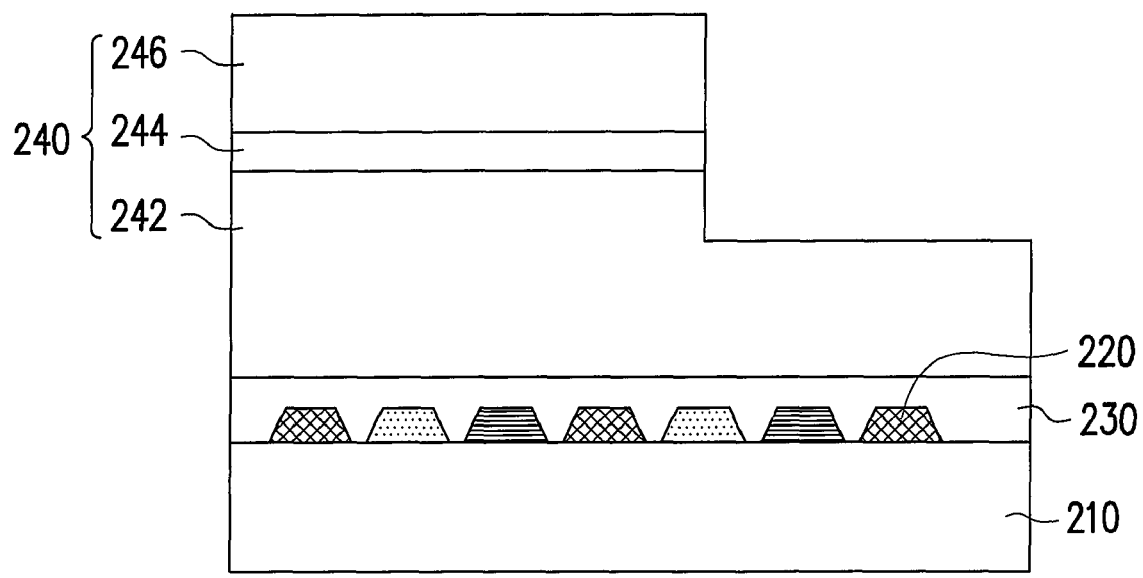

Thereafter, a high temperature gallium nitride structure can be directly formed on the epitaxial lateral overgrowth layer 230. As shown in FIG. 2E, a first type doped semiconductor layer 242, a light emitting layer 244 and a second type doped semiconductor layer 246 are sequentially formed on the epitaxial lateral overgrowth layer 230. The light emitting layer 244 is formed on a portion of the first type doped semiconductor layer 242. In general, the first type doped semiconductor layer 242, the light emitting layer 244 and the second type doped semiconductor layer 246 are called an epitaxial layer 240. The first type doped semiconductor layer 242 and the second type doped semiconductor layer 246 are an n-type semiconductor layer and a p-type semiconductor, respectively. Furthermore, the matrix material for forming the first type doped semiconductor layer 242 and the second type doped semiconductor layer 246 is gallium nitride. In addition, the light emitting layer 244 can be a multiple quantum well (MQW), a single quantum well (SQW) or a double hetero (DH) structure.

Figure 2F:
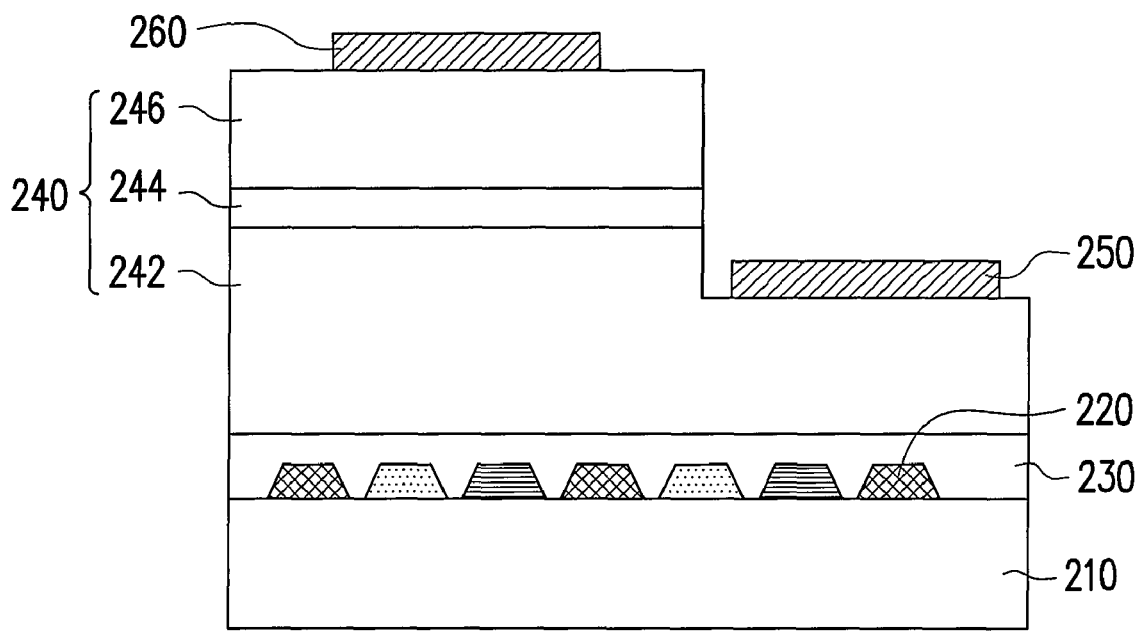

Finally, as shown in FIG. 2F, a first electrode 250 and a second electrode 260 are respectively formed on the exposed first type doped semiconductor layer 242 and the second type doped semiconductor layer 246. The first electrode 250 is electrically connected to the first type doped semiconductor layer 242, and the second electrode 260 is electrically connected to the second type doped semiconductor layer 246. Thus, the process of forming a light emitting diode structure 200 of the present invention is complete.

Figure 3:
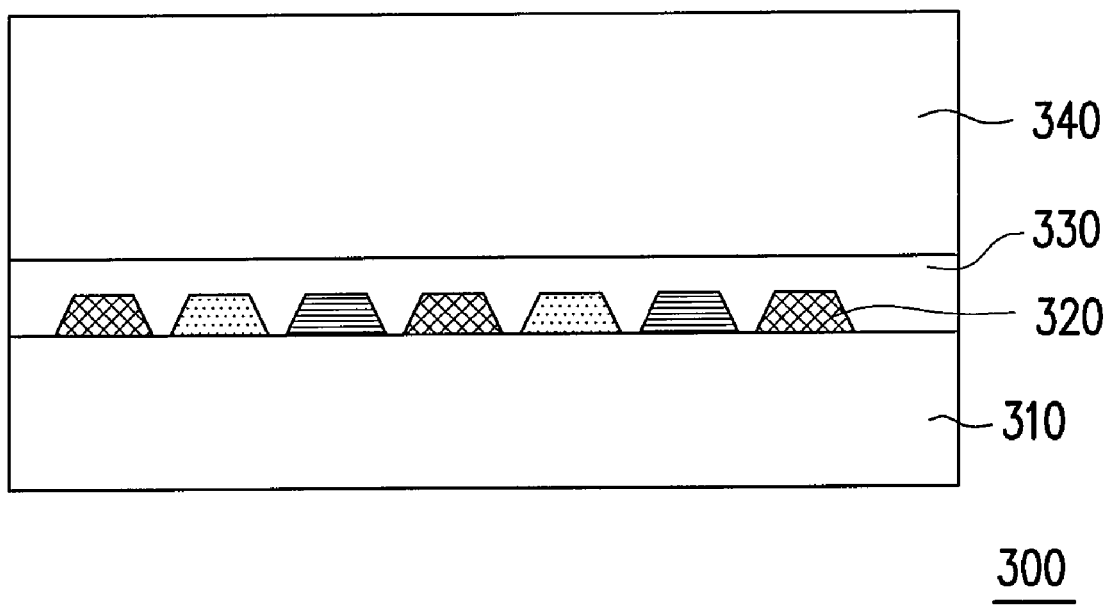
FIG. 3 is a schematic cross-sectional view of an optoelectronic device according to the present invention.

The strain-reducing seed layer 220 can be applied to other optoelectronic device beside the foregoing light emitting diode structure. As shown in FIG. 3, the method of fabricating this optoelectronic device 300 also includes forming a strain-reducing seed layer 320 on a substrate 310 and then selectively forming an epitaxial lateral overgrowth layer 330. Next, according to user's requirement, an optoelectronic device unit 340, for example, a laser diode, a photo detector or a solar cell, is formed on the epitaxial lateral overgrowth layer 330. Thus, the process of forming an optoelectronic device 300 of the present invention is complete.

In summary, the light emitting diode structure and the optoelectronic device of the present invention are produced by forming a stain-reducing seed layer having a plurality of clusters on a substrate. The material of the clusters is selected from a group consisting of aluminum nitride, magnesium nitride and indium nitride. The strain-reducing seed layer is utilized to reduce the structural strain of subsequently formed high temperature material. Accordingly, the dislocation density of the subsequently deposited film layer is lowered, and the optoelectronic characteristics of the light emitting diode structure and the optoelectronic device are improved due to the strain-reducing seed layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a light emitting diode structure, comprising:

provicing a substrate;

spreading a metallic material on the substrate, wherein the metallic material is selected from a group consisting of aluminum, magnesium and indium;

providing a nitrogen-containing gas so that the metallic material reacts with the nitrogen-containing gas to form a strain-reducing seed layer, wherein the strain-reducing seed layer comprises a plurality of clusters, and a material of the clusters is selected from a group consisting of aluminum nitride, magnesium nitride and indium nitride;

forming an epitaxial layer on the strain-reducing seed layer, wherein the epitaxial layer comprises a first type doped semiconductor layer, a light emitting layer and a second type doped semiconductor layer sequentially stacked over the strain-reducing seed layer, and the light emitting layer is formed on a portion of the first type doped semiconductor layer; and forming a first electrode and a second electrode on the exposed first type doped semiconductor layer and the second type doped semiconductor layer respectively, wherein the first electrode is electrically connected to the first type doped semiconductor layer, and the second electrode is electrically connected to the second type doped semiconductor layer.

2. The method of fabricating the light emitting diode structure according to claim 1, further comprising forming an epitaxial lateral overgrowth layer to cover the clusters and the substrate after forming the strain-reducing seed layer.

3. The method of fabricating the light emitting diode structure according to claim 2, wherein a material of the epitaxial lateral overgrowth layer comprises aluminum-indium-gallium nitride.

4. The method of fabricating the light emitting diode structure according to claim 1, wherein a material of the substrate comprises silicon, glass, gallium arsenide, gallium nitride, aluminum-gallium arsenide, gallium phosphide, silicon carbide, indium phosphide, boron nitride, zinc oxide, aluminum oxide, lithium aluminate or aluminum nitride.

5. The method of fabricating the light emitting diode structure according to claim 1, wherein the nitrogen-containing gas comprises ammonia, 1-Dimethylhydrazine (UDMHy) or Tertiarybutylhydrazine (TBHy).

6. The method of fabricating the light emitting diode structure according to claim 1, wherein the first type doped semiconductor layer is an n-type semiconductor layer, and the second type doped semiconductor layer is a p-type semiconductor layer.

7. The method of fabricating the light emitting diode structure according to claim 1, wherein the light emitting layer comprises a multiple quantum well (MQW), a single quantum well (SQW) or a double hetero (DH) structure.

8. A method of fabricating an optoelectronic device, comprising:
providing a substrate;
spreading a metallic material on the substrate, wherein the metallic material is selected from a group consisting of aluminum, magnesium and indium;
providing a nitrogen-containing gas so that the metallic material reacts with the nitrogen-containing gas to form a strain-reducing seed layer, wherein the strain-reducing seed layer comprises a plurality of clusters, and a material of the clusters is selected from a group consisting of aluminum nitride, magnesium nitride and indium nitride; and
forming an optoelectronic device unit on the strain-reducing seed layer.

9. The method of fabricating the optoelectronic device according to claim 8, further comprising forming an epitaxial lateral overgrowth layer to cover the clusters and the substrate after forming the strain-reducing seed layer.

10. The method of fabricating the optoelectronic device according to claim 9, wherein a material of the epitaxial lateral overgrowth layer comprises aluminum-indium-gallium nitride.

11. The method of fabricating the optoelectronic device according to claim 8, wherein the nitrogen-containing gas comprises ammonia, 1-Dimethylhydrazine (UDMHy) or Tertiarybutylhydrazine (TBHy).

* * * * *